US012712146B2

(12) United States Patent
Sugawara et al.

(10) Patent No.: US 12,712,146 B2
(45) Date of Patent: Aug. 18, 2026

(54) SAMPLE HOLDER, ELECTRON MICROSCOPE SYSTEM AND SAMPLE OBSERVATION METHOD

(71) Applicant: Hitachi, Ltd., Tokyo (JP)

(72) Inventors: Akira Sugawara, Tokyo (JP); Fumiaki Ichihashi, Tokyo (JP); Toshiaki Tanigaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 339 days.

(21) Appl. No.: 18/603,269

(22) Filed: Mar. 13, 2024

(65) Prior Publication Data

US 2024/0429020 A1 Dec. 26, 2024

(30) Foreign Application Priority Data

Jun. 22, 2023 (JP) ................................ 2023-102297

(51) Int. Cl.
*H01J 37/20* (2006.01)
*H01J 37/26* (2006.01)

(52) U.S. Cl.
CPC ............ *H01J 37/20* (2013.01); *H01J 37/261* (2013.01); *H01J 2237/006* (2013.01); *H01J 2237/2001* (2013.01); *H01J 2237/2002* (2013.01); *H01J 2237/2602* (2013.01)

(58) Field of Classification Search
CPC .... H01J 37/20; H01J 37/261; H01J 2237/006; H01J 2237/2001; H01J 2237/2002; H01J 2237/2602; H01J 37/26; H01J 2237/2802
USPC ................................ 250/306, 307, 310, 311
See application file for complete search history.

(56) References Cited

U.S. PATENT DOCUMENTS

2012/0305769 A1 12/2012 Yaguchi et al.
2015/0137001 A1* 5/2015 Hiroki .................... H01J 37/18 250/441.11
2016/0203943 A1 7/2016 Oyagi et al.
2016/0260574 A1 9/2016 Schmaunz et al.
2017/0323764 A1 11/2017 Muto et al.

FOREIGN PATENT DOCUMENTS

JP 2015-065100 A 4/2015

OTHER PUBLICATIONS

Partial European Search Report received in corresponding European Application No. 24165053.0 dated Sep. 19, 2024.

(Continued)

*Primary Examiner* — Michael Maskell
(74) *Attorney, Agent, or Firm* — MATTINGLY & MALUR, PC

(57) ABSTRACT

A sample holder enables easy control of a progress rate of a chemical reaction of a sample to be observed and facilitates observation of the chemical reaction. A sample holder includes a cylindrical holder outer cylinder, a sample holding section that is connected to one end of the holder outer cylinder and holds a sample, a gas reservoir tank that is connected to another end of the holder outer cylinder and stores gas, an orifice for ejecting the gas stored in the gas reservoir tank into the holder outer cylinder, and a valve for controlling a flow of the gas stored in the gas reservoir tank into the orifice. The sample holding section has an open end for discharging the gas supplied from the gas reservoir tank and having passed through the sample.

16 Claims, 5 Drawing Sheets

(56) References Cited

OTHER PUBLICATIONS

Takahashi, Yoshimasa et al., "A combined environmental straining specimen holder for high-voltage electron microscopy", Ultramicroscopy, Aug. 4, 2010, pp. 1420-1427, vol. 11, No. 11, Amsterdam, NL.

Extended European Search Report received in corresponding European Application No. 24165053.0 dated Jan. 20, 2025.

* cited by examiner (SIDE SECTIONAL VIEW)
(PLAN SECTIONAL VIEW)
110
120
130
140
150
160
190
200
210
212
220
222
223
224
226
230
232
240
250
300
320
330
340
350
360
400
410
510
520
710
730
740

CONTROL SIGNAL V1
DRIVE VOLTAGE V2
PRESSURE PROFILE P1
PRESSURE PROFILE P2
SAMPLE HEATING
IMAGE ACQUISITION BY IMAGE ADDITION
V11
V12
V21
V22
P11
P21
T1
T2
t1
t2
t3
t4
N1
N2

200
220
250
240
520
110
510
120
850
170
180
320
150
300
820
O
C
810

SAMPLE HOLDER, ELECTRON MICROSCOPE SYSTEM AND SAMPLE OBSERVATION METHOD

CROSS-REFERENCE TO RELATED APPLICATION

This application claims priority to Japanese Patent Application No. 2023-102297 filed on Jun. 22, 2023, the entire contents of which are incorporated by reference herein.

BACKGROUND OF THE INVENTION

The present invention relates to a sample holder, an electron microscope system and a sample observation method using the same.

In recent years, in order to achieve carbon neutrality, for environment-responsive functional materials such as catalysts and electrodes that are used to put fuel cells, secondary batteries, hydrogen synthesis, and artificial photosynthesis into practical use, there is a need for technology for analyzing structures and electromagnetic fields during gas reactions at the atomic level under environmental control.

Environmental transmission electron microscopy is a method for examining a change in the structure of a catalyst or the like placed in gas due to a reaction process. When a chemical reaction is observed by introducing gas into an electron microscope, the degree of vacuum inside the electron microscope may decrease, a vacuum evacuation system may malfunction, or the gas enters an electron source and cause electrical discharge. To solve such problems, there are two major technological trends in environmental transmission electron microscopy at present.

The first method is to use an electron microscope provided with a differential pumping type sample chamber. A multistage intermediate chamber is installed in a column of the electron microscope, and each of stages is evacuated to create a difference in pressure between the stages. Therefore, pressure in the vicinity of a sample can be kept high while pressure in an electron gun can be lowered, that is, a high degree of vacuum can be maintained in the electron gun. In this method, anything other than the sample does not enter an electron beam path, and high-contrast observation is possible, but gas pressure in the vicinity of the sample cannot be high.

The second method is a method using a separating membrane type environmental cell. Gas and a sample to be observed are sealed in the separating membrane type environmental cell, which is a sample holder, and the reaction of the sample in the gas is observed using an electron beam that has passed through the environmental cell. This method has the problem that the separating membrane of the environmental cell enters the electron beam path, which causes noise in an image, but it is also possible to increase gas pressure in the vicinity of the sample to approximately atmospheric pressure.

Japanese Unexamined Patent Application Publication No. 2015-65100 discloses that gas is introduced into a side-entry sample holder disposed in an electron microscope using a gas introduction device connected to a gas cylinder disposed outside the electron microscope, and the gas is supplied to a surface of the sample from a gas nozzle.

U.S. Patent Application Publication No. 2016/0260574 discloses that pulsed gas is introduced into a charged particle beam device via a high-speed valve, creating a situation in which the concentration of the gas is high in the vicinity of a surface of a sample in an extremely short period of time, and gas ionized by charged particles suppresses charging on the surface of the sample.

SUMMARY OF THE INVENTION

The gas supply method disclosed in Japanese Unexamined Patent Application Publication No. 2015-65100 requires drawing the gas from the gas cylinder to the vicinity of the sample using a long and thin pipe. Therefore, even when the flow rate of an outlet is adjusted by the gas introduction device, the problem tends to occur that the relaxation time for the gas pressure to reach a steady state is very long. For example, after an operation of adjusting the flow rate is performed, the pressure may increase or decrease slowly, and it may take several seconds to several tens of seconds to reach the steady state of the gas pressure.

In addition, the gas supply method disclosed in Japanese Unexamined Patent Application Publication No. 2015-65100 aims to hold the sample under fixed pressure over time. The rate of a chemical reaction is generally a function of temperature and gas pressure. Since it is required to prevent the electron microscope from stopping due to the introduction of gas, when the pressure in the vicinity of the sample cannot be increased sufficiently, the chemical reaction may not progress fast enough for observation.

Although U.S. Patent Application Publication No. 2016/0260574 discloses a technique with a different purpose of suppressing the charging of a sample, the technique has a common feature with the solution of the present invention described later in that pulsed gas is introduced through a high-speed valve. However, U.S. Patent Application Publication No. 2016/0260574 is assumed to be applied to a scanning electron microscope, and in general, a sample is placed in an environment with few obstacles in the scanning electron microscope, and thus designing a flow path for pulsed gas is easy. Particularly in a case where a sample holder for a transmission electron microscope is used, special consideration needs to be taken since a vibration associated with a valve operation easily cause a reduction in image quality.

An object of the present invention is to provide a sample holder, an electron microscope system, and a sample observation method that are particularly suitable for observation with a transmission electron microscope or a scanning transmission electron microscope, can switch an environment in which a sample is placed in a short time, and make it easy to observe a chemical reaction of the sample.

A sample holder according to an aspect of the present invention holds a sample to be observed using an electron microscope, and includes a cylindrical holder outer cylinder, a sample holding section that is connected to one end of the holder outer cylinder and holds the sample, a gas reservoir tank that is connected to another end of the holder outer cylinder and stores gas, an orifice for ejecting the gas stored in the gas reservoir tank into the holder outer cylinder, and a valve for controlling a flow of the gas stored in the gas reservoir tank into the orifice. The sample holding section has an open end for discharging the gas supplied from the gas reservoir tank and having passed through the sample.

A sample holder, an electron microscope system, and a sample observation method that can easily control the progress rate of a chemical reaction of a sample to be observed, and make it easy to observe the chemical reaction. Problems, configurations, and effects other than those described above will be made clear by the following description of embodiments.

DETAILED DESCRIPTION OF THE PREFERRED EMBODIMENTS

Figure 1:
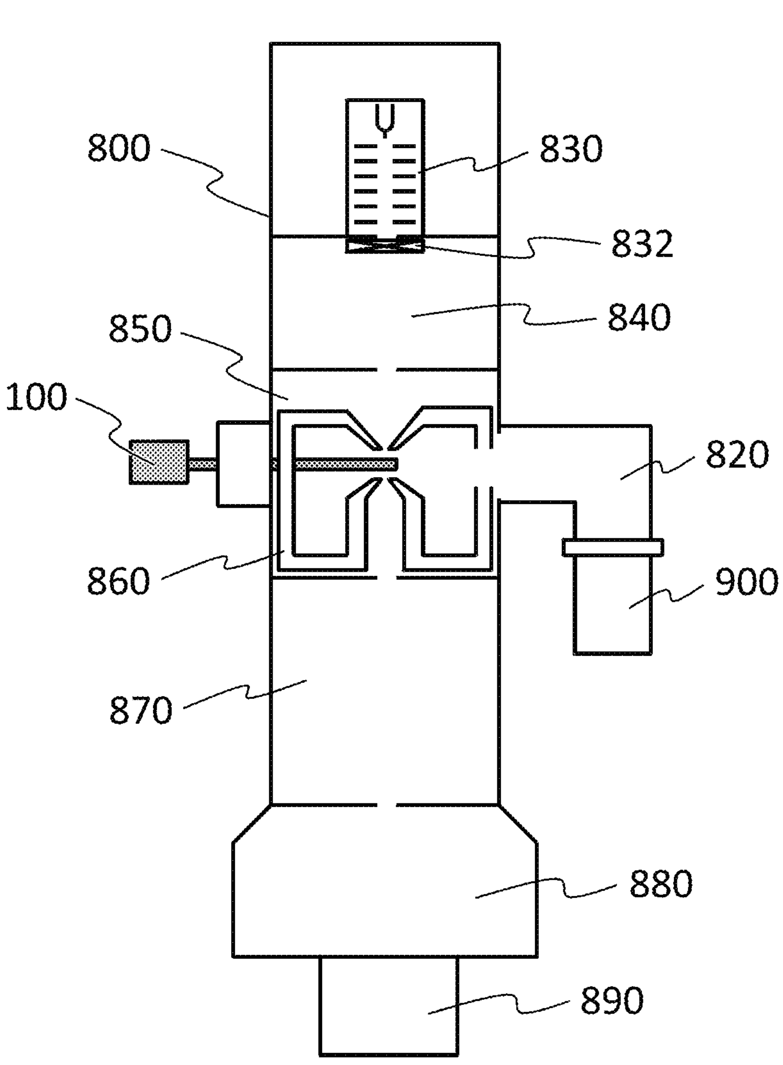
FIG. 1 is a schematic configuration diagram of a transmission electron microscope.

FIG. 1 illustrates a schematic configuration of a transmission electron microscope (TEM) as an example of a charged particle beam device. A sample chamber 850 includes an objective lens 860. In the TEM, a sample to be observed is held in a sample holder 100, and the sample holder 100 is disposed so as to be inserted into the objective lens 830 in general. Since the sample holder 100 is inserted from a side surface of a column 800 of the TEM, the sample holder may be referred to as a side-entry sample holder. Electrons are emitted from an electron gun 830, pass through an irradiation system 840, the sample chamber 850, the sample held in the sample holder 100, an enlargement system 870, and an observation chamber 880, and are incident on a camera 890 where an image is recorded.

In order for the electrons to travel a distance of several meters without colliding with gas molecules and the like, the inside of the column 800 including an electron optical system needs to be evacuated. A vacuum pump 900 and the column 800 are connected to each other via a discharge pipe 820. When pressure in the sample chamber 850 or pressure in the irradiation system 840 increases, gas may enter the electron gun 830 and cause severe electrical discharge. Therefore, an interlock mechanism that stops the TEM from operating when the pressure increases may be provided. Particularly, a gun valve 832 that separates the electron gun 830 from the irradiation system 840 downstream is an important component.

Figure 2:
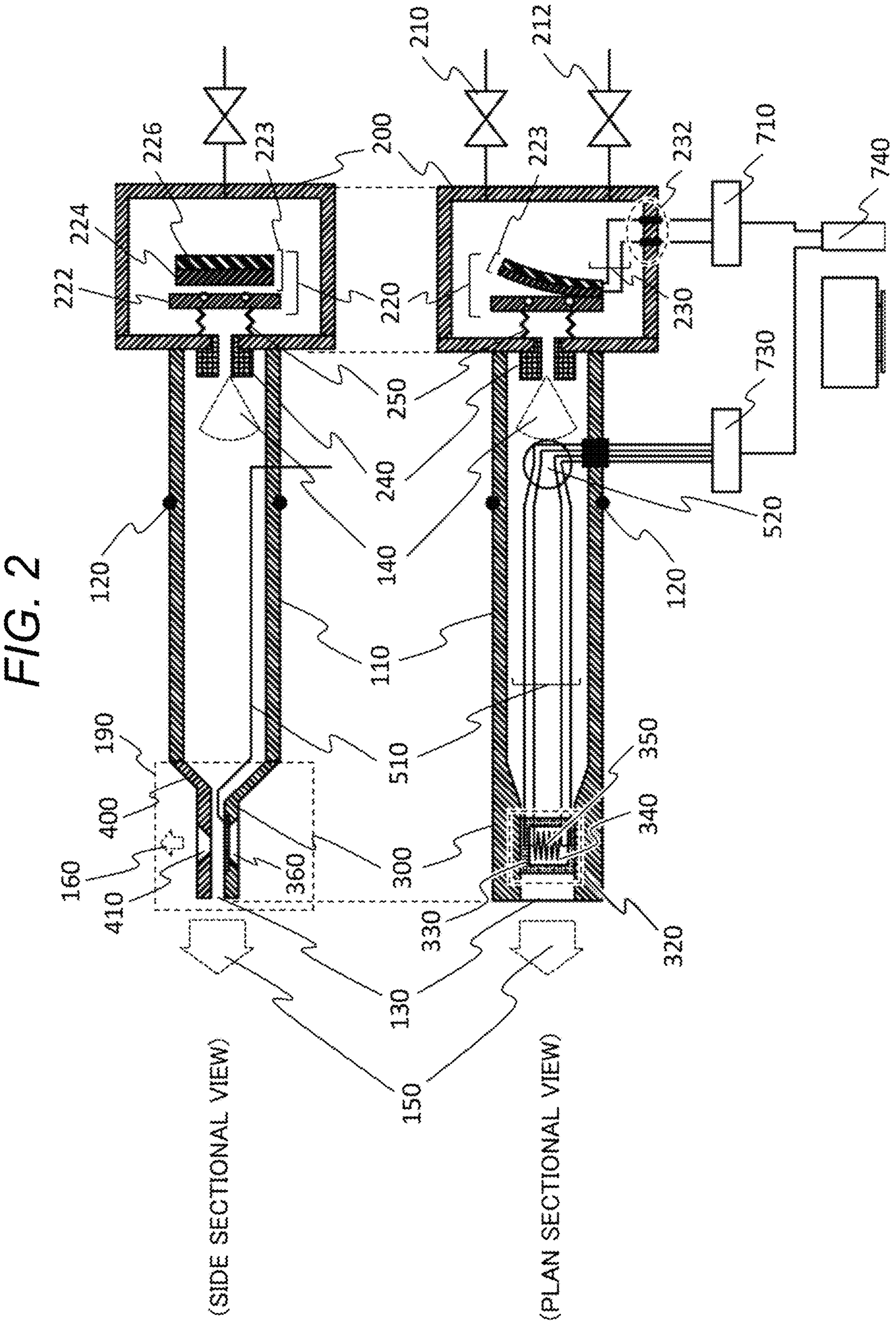
FIG. 2 is a diagram illustrating an example of a configuration of a side-entry sample holder.

FIG. 2 is a schematic side sectional view and a schematical plan sectional view illustrating an example of a configuration of the side-entry sample holder 100. The sample is placed on a MEMS heating chip 320. The MEMS heating chip 320 is fixed onto a sample stage 300 connected to a cylindrical holder outer cylinder 110. The sample stage 300 has an electron beam passage hole 360 at a position where the MEMS heating chip 320 is fixed. The MEMS heating chip 320 includes a silicon frame 330, a membrane 340, and a metal heater 350. The membrane 340 is a thin silicon nitride membrane supported by the silicon frame 330. The sample is placed on the membrane 340. An electron beam from the electron gun 830 passes through the membrane 340. The metal heater 350 is disposed on the membrane 340 and can control a temperature environment for the sample on the membrane 340. The structure of the MEMS heating chip 320 can be easily formed using a MEMS process. An upper cover 400 connected to the holder outer cylinder 110 is disposed above the sample stage 300 (electron gun side). The upper cover 400 has an electron beam passage hole 410. The optical axis of the electron beam from the electron gun 830 passes through the electron beam passage hole 410 of the upper cover 400, the membrane 340 of the MEMS heating chip 320, and the electron beam passage hole 360 of the sample stage 300. A portion corresponding to a combination of the sample stage 300 and the upper cover 400 illustrated in FIG. 2 may be referred to as a sample holding section 190.

When a source measure unit 730 that functions as a direct-current power source and a voltage measuring device is used to supply electricity to the metal heater 350, heater resistance can be determined based on four-terminal resistance sensing and can be associated with temperature. A heater wiring 510 connects the metal heater 350 to the source measure unit 730 via a current introduction terminal 520 through which a current can be introduced while vacuum is separated from atmosphere. A space in the holder outer cylinder 110 is used to dispose the heater wiring 510. When the side-entry sample holder 100 is inserted in the sample chamber 850, the heater wiring 510 is passed through the inside of the holder outer cylinder 110 at least until the heater wiring 510 reaches a position (position where an O ring 120 is disposed) where the side-entry sample holder 100 is inserted in the sample chamber 850. Thereafter, the heater wiring 510 is drawn out of the sample holder 100 such that the heater wiring 510 is connected to the source measure unit 730.

A gas reservoir tank 200 is disposed to face the sample holding section 190 via the holder outer cylinder 110. The gas reservoir tank 200 is evacuated in advance through an exhaust/purge valve 212 using a vacuum pump (not illustrated) or the like, and then gas is introduced into the gas reservoir tank 200 through the gas introduction valve 210. It is possible to introduce mixed gas by using an appropriate gas mixer. Performing gas purge via the exhaust/purge valve 212 is also effective in increasing gas purity.

The gas is supplied from the gas reservoir tank 200 to the MEMS heating chip 320 through a high-speed valve 220, a gas ejection orifice 240, and the holder outer cylinder 110 that also serves as a gas pipe. An example will be described in which a cantilever type piezoelectric driven valve (piezoelectric valve) that can open and close at a high speed and has less vibration during operation is used as the high-speed valve 220. However, an electromagnetic valve or a heating valve may be used as the high-speed valve 220.

The cantilever type piezoelectric valve is connected to a piezoelectric element drive power source 710 via a high-voltage wiring 230 and a high-voltage introduction terminal 232. When a high voltage is not applied to a cantilever 223 which a valve sheet 224 and a piezoelectric element 226 are bonded together, a sealing ring 222 and the valve sheet 224 are in close contact with each other, and the gas reservoir tank 200 and the holder outer cylinder 110 are separated from each other. Meanwhile, when a high voltage is supplied to the cantilever 223, the piezoelectric element 226 warps, a gap is formed between the valve sheet 224 and the sealing ring 222 (a state illustrated in FIG. 2), and the gas flows from the gas reservoir tank 200 to the holder outer cylinder 110 through the gas ejection orifice 240. In the example illustrated in FIG. 2, by applying a voltage to the piezoelectric element 226, a tip of the cantilever 223 moves in a longitudinal direction of the holder outer cylinder 110. Meanwhile, the flow of the gas from the gas reservoir tank 200 into the holder outer cylinder 110 may be controlled by causing expansion and contraction associated with control of a voltage to the piezoelectric element 226 on a plane perpendicular to the longitudinal direction of the holder outer cylinder 110.

Since the valve is a mechanical opening/closing mechanism, an operation of the valve causes a vibration. Since the weight of a moving part of the piezoelectric valve is small, the piezoelectric valve has an advantage of reducing energy consumption and vibration energy for operation. Due to the advantage, the piezoelectric element can be downsized so that a flow rate control mechanism can be incorporated in the sample holder 100. To further suppress a vibration, in the configuration illustrated in FIG. 2, the high-speed valve 220 is not directly attached to the gas reservoir tank 200 and is attached to the gas reservoir tank 200 with vibration-proof bellows 250 serving as a vibration-proof mechanism and sandwiched between the high-speed valve 220 and the gas reservoir tank 200.

When the ratio of the length of a gas path of the gas ejection orifice 240 to the diameter of the gas path of the gas ejection orifice 240 is increased, an angular distribution of an ejected gas stream 140 from the orifice 240 becomes narrower. This reduces the probability that gas molecules collide with and be scattered by the holder outer cylinder 110, and the gas molecules can be incident on the sample on the MEMS heating chip 320 with high efficiency.

The gas that has passed through the sample on the MEMS heating chip 320 flows mostly from an open end 130 of the sample holder 100 at a tip of the sample holder 100 into the column 800 as an exhaust gas stream 150, and a part of the gas flows from the electron beam passage hole 410 into the column 800 as an exhaust gas stream 160. Since the exhaust gas stream 160 from the electron beam passage hole 410 may reach the electron gun 830, it is desirable that the cross-sectional area of the open end 130 be made sufficiently larger than the cross-sectional area of the electron beam passage hole 410.

The sample holder 100 according to the present embodiment includes the gas reservoir tank 200 that stores gas, and includes a supply mechanism that supplies the gas stored in the gas reservoir tank 200 to the sample. A method for supplying the gas to the sample in the sample holder 100 is described below.

Figure 3:
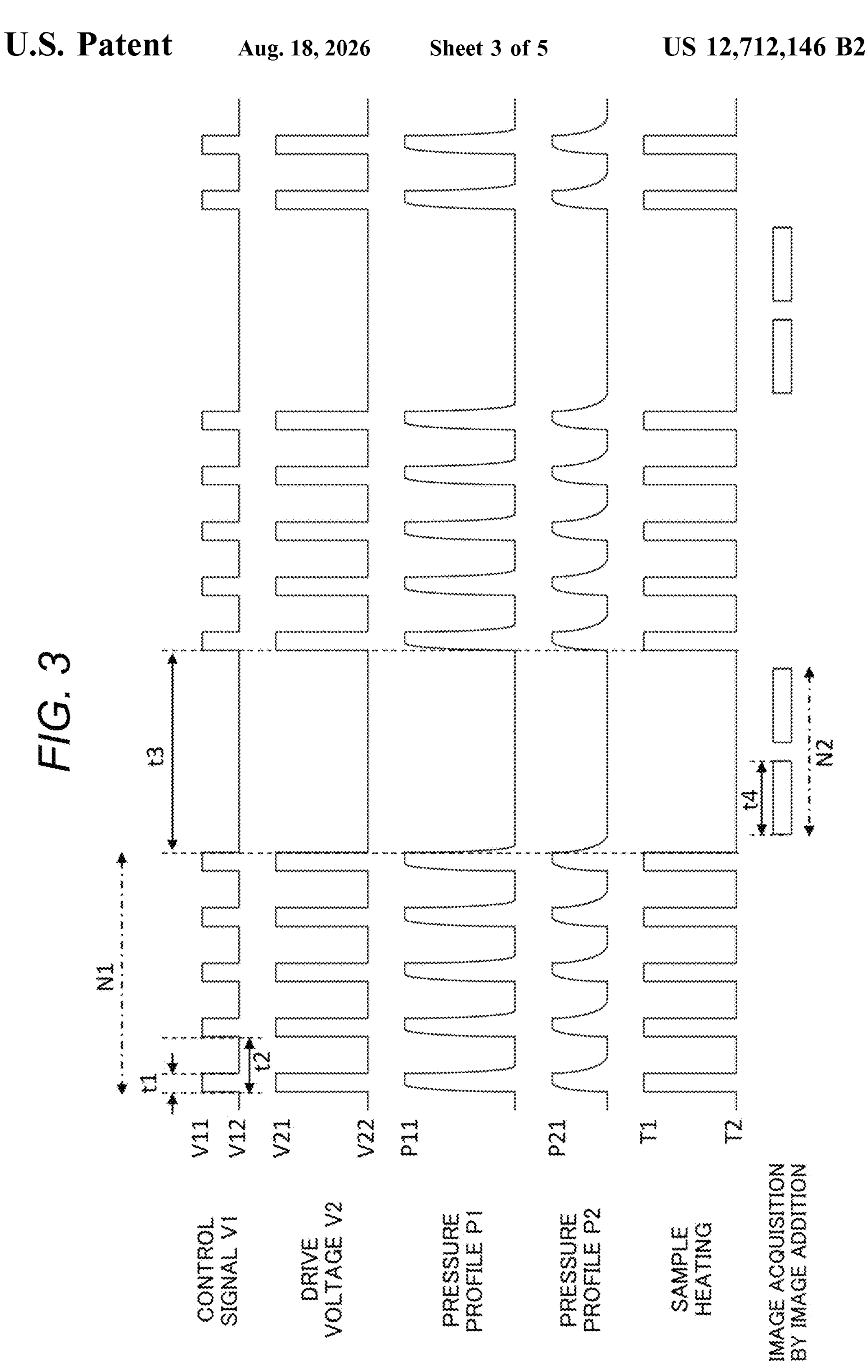
FIG. 3 is a diagram for describing a method for controlling supply of pulsed gas to the sample holder.

The sample holder 100 supplies pulsed gas to the sample. That is, a pulse voltage is applied to the piezoelectric element 226, and the piezoelectric element 226 cause the high-speed valve 220 to operate to open and close in a pulse mode. A method for controlling the supply of the pulsed gas in the sample holder 100 is described with reference to FIG. 3. FIG. 3 schematically illustrates a control sequence by a control computer 740, and changes in pressure, temperature, and the like due to the control sequence.

The control computer 740 transmits a control signal V1 to the piezoelectric element drive power source 710. The control signal V1 has a pulse waveform defined by an opening degree control voltage V11, a base voltage V12, a pulse time period t1, and a pulse time interval t2. The piezoelectric element drive power source 710 receives the control signal V1 and applies, to the piezoelectric element 226, a drive voltage V2 having a pulse waveform defined by a peak voltage V21, a base voltage V22, the pulse time period t1, and the pulse time interval t2. The magnitude of the peak voltage V21 depends on the magnitude of the opening degree control voltage V11. The opening degree of the valve may be kept constant and only opening and closing may be essentially controlled. Generally, the peak voltage V21 is higher than the base voltage V22, and the high-speed valve 220 is configured such that the high-speed valve 220 is in an open state when the peak voltage V21 is applied, and is in a closed state when the base voltage V22 is applied. In the example illustrated in FIG. 3, the piezoelectric element drive power source 710 continuously generates a pulse drive voltage N1 times repeatedly in response to a pulse control signal repeatedly continuously transmitted to the piezoelectric element drive power source 710 N1 times by the control computer 740. Therefore, the supply of the gas by opening and closing of the high-speed valve 220 is repeatedly performed N1 times.

A pressure profile P1 is a pressure profile in the vicinity of the surface of the sample in the sample holder 100. The gas supply method described in Japanese Unexamined Patent Application Publication No. 2015-65100 is to draw gas through the long and thin pipe and allow the gas to reach a steady state of gas pressure over a predetermined period of time. On the other hand, the sample holder 100 according to the present embodiment introduces gas necessary for a sample reaction by making it possible to control the gas pressure in the vicinity of the surface of the sample in an extremely short response time. In the sample holder 100, a small-diameter path that the gas passes through is only the high-speed valve 220 and the orifice 240 following the high-speed valve 220, that is the path has a very short length. Therefore, the pressure within the sample holder 100 can be changed rapidly in a short response time in response to the opening and closing of the high-speed valve 220.

When the length of the gas ejection orifice 240 is increased, the angular distribution of the released gas stream decreases and the efficiency of gas reaching the sample increases as described above, but the conductance of the gas decreases and an appropriate size is required. For a similar reason, when the effective sectional area of the holder outer cylinder 110 that also serves as a gas pipe is set to be at least 10 times the effective cross-sectional area of the gas ejection orifice 240, it is effective to secure a short response.

A pressure profile P2 is a pressure profile in the sample chamber 850 of the TEM. Peak pressure P11 of the pressure profile P1 and peak pressure P21 of the pressure profile P2 have a relationship of the peak pressure P11>the peak pressure P12. The amount of gas to be supplied is determined based on the magnitude of the peak voltage V21 applied to the piezoelectric element 226 and the time period t1 for applying the peak voltage V21. Meanwhile, the introduced gas is quickly discharged by the vacuum pump 900 and thus a change in the pressure within the sample chamber 850 can be kept small. As described above, the supply of the pulsed gas according to the present embodiment is effective in that the introduction of the gas to the vicinity of the surface of the sample can suppress a reduction in the pressure within the column 800.

In a case where the peak pressure P21 of the pressure profile P2 within the sample chamber 850 is in a range lower than interlock threshold pressure of the TEM, it is possible to acquire an image at any time and at a desired time. In general, the progress rate of the chemical reaction increases as the peak pressure P11 of the pressure profile P1 in the vicinity of the surface of the sample increases. In addition, the progress rate of the chemical reaction increases as the ratio of the pulse time period t1 to the pulse time interval t2, that is, t1/t2 increases. Therefore, by controlling these parameters, the reaction rate of the sample can be controlled. Since the reaction rate is suppressed and time division measurement is performed, it is possible to acquire snapshot images of the progress of the chemical reaction without using a camera capable of high-speed image capturing.

Meanwhile, for high-precision measurement that requires long-term measurement by stopping the reaction after a certain chemical reaction has progressed, such as electron holography that requires addition of images to increase a signal-to-noise ratio, the supply of the pulsed gas is controlled as follows. The control computer 740 transmits, to the piezoelectric element drive power source 710, a control signal with a base voltage V12 in a time period t3 after repeatedly transmitting a pulse control signal N1 times. Therefore, after the piezoelectric element drive power source 710 repeatedly continuously generates a pulse drive voltage N1 times, the piezoelectric element drive power source 710 applies, to the piezoelectric element 226, a drive voltage that becomes a base voltage V22 in the time period t3. Therefore, the chemical reaction progresses in a period of time (t2×N1) for applying the pulse drive voltage, and stops in the time period t3 after the period of time. Accordingly, the acquisition of images of exposure time t4 is repeatedly performed N2 times in the time period t3. By adding the images acquired N2 times, it is possible to acquire an image with a high signal-to-noise ratio.

As described above, as the supply of the gas to the sample, a pulsed gas supply period and a gas supply stop period are repeated, and an image with a high signal-to-noise ratio is acquired in the gas supply stop period. Therefore, electron holography measurement can be performed for a process in which the chemical reaction progresses.

Some chemical reactions do not progress much with gas supply alone, but progress significantly in a temperature environment at a certain level or higher (for example, temperature T1 or higher). In this case, it is necessary to heat the sample. The chemical reaction progresses in the time period t1 in which the sample is heated and the pulsed gas is supplied. Some the chemical reaction may involve a decomposition reaction when the sample is kept at the temperature T1 or higher in a time period (t2−t1) in which the pulsed gas is not supplied. In such a chemical reaction, in a time period in which the pulsed gas is not supplied, it is desirable to reduce the temperature of the sample to a temperature T2 at which a significant chemical reaction does not occur. Therefore, as indicated by the sample heating waveform in FIG. 3, it is necessary to synchronize the heating of the sample with the supply of the pulsed gas. Therefore, the control computer 740 controls the source measure unit 730 to supply a current for increasing the temperature to the heater wiring 510 synchronizing with the control signal V1. Since the metal heater 350 of the MEMS heating chip 320 has a small heat capacity, the temperature of the sample rapidly increases due to the supply of the current from the source measure unit 730 and rapidly decreases due to the stop of the supply of the current.

When the pulsed gas is introduced to the vicinity of the sample, heat dissipation occurs due to colliding molecules and the temperature of the sample decreases. To prevent the decrease in the temperature, it is desirable to keep the temperature of the sample at the temperature T1 by the source measure unit 730 performing four-terminal sensing to measure the resistance of the metal heater 350, determining the temperature of the sample from the resistance value of the metal heater 350, and performing feedback control on the heater current by PID control or the like.

In addition, the sample holder 100 according to the present embodiment includes the flow rate control mechanism that supplies the pulsed gas. After the gas reservoir tank 200 is filled with the gas, the sample holder 100 can be inserted in the column 800 and used in a state of being mechanically separated from a gas supply system. This can avoid transmission of a vibration of the gas supply system to the sample holder 100 through a pipe.

Modifications of the sample holder 100 are described below.

(First Modification)

Figure 4:
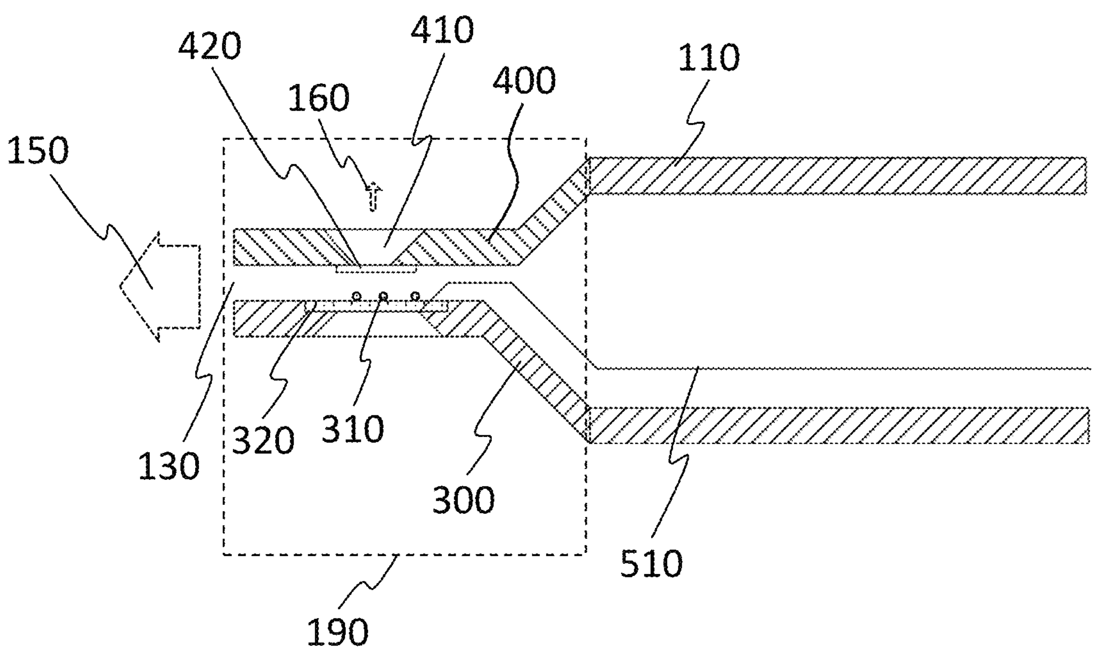
FIG. 4 is a diagram for describing a sample holder according to a first modification.

FIG. 4 illustrates an example of a configuration of a sample holder according to a first modification. To suppress the ejection of gas from an electron beam passage hole 410 of an upper cover 400 and concentrate a flow of the gas on a gap between a sample stage 300 and the upper cover 400, an electron beam permeable membrane 420 is disposed to cover the electron beam passage hole 410 of the upper cover 400 in the sample holder according to the first modification. FIG. 4 illustrates the vicinity of the sample stage 300, and other configurations are the same as or similar to those of the sample holder 100 illustrated in FIG. 2.

Since the sample holder 100 has the open end, the electron beam permeable membrane 420 does not require perfect airtightness or mechanical strength. This feature differs from a membrane of a sealed cell that requires mechanical strength and resistance to damage caused by an electron beam in order to perfectly separate gas/liquid from a sample chamber 850 of a TEM. It is sufficient that the electron beam permeable membrane 420 can significantly reduce the exhaust gas stream 160 passing through the electron beam passage hole 410.

Meanwhile, since the electron beam permeable membrane 420 is located at a height of several tens to hundreds of μm or more from the sample 310, the electron beam permeable membrane 420 may give a noise image that causes defocusing. To reduce the noise image, it is effective that the electron beam permeable membrane 420 is made of a material that produces a low-strength noise image, such as graphene. Alternatively, the electron beam permeable membrane 420 may be a silicon nitride membrane with a plurality of holes of several tens to several hundreds of μm formed by a MEMS technique. In this case, by observing the sample 310 using an electron beam having passed through the holes of the electron beam permeable membrane 420, it is possible to suppress degradation of an image due to the presence of the electron beam permeable membrane 420.

FIG. 4 illustrates the assumption that the sample 310 is a fine particle with catalytic activity, such as precious metal or ceramics.

(Second Modification)

Figure 5:
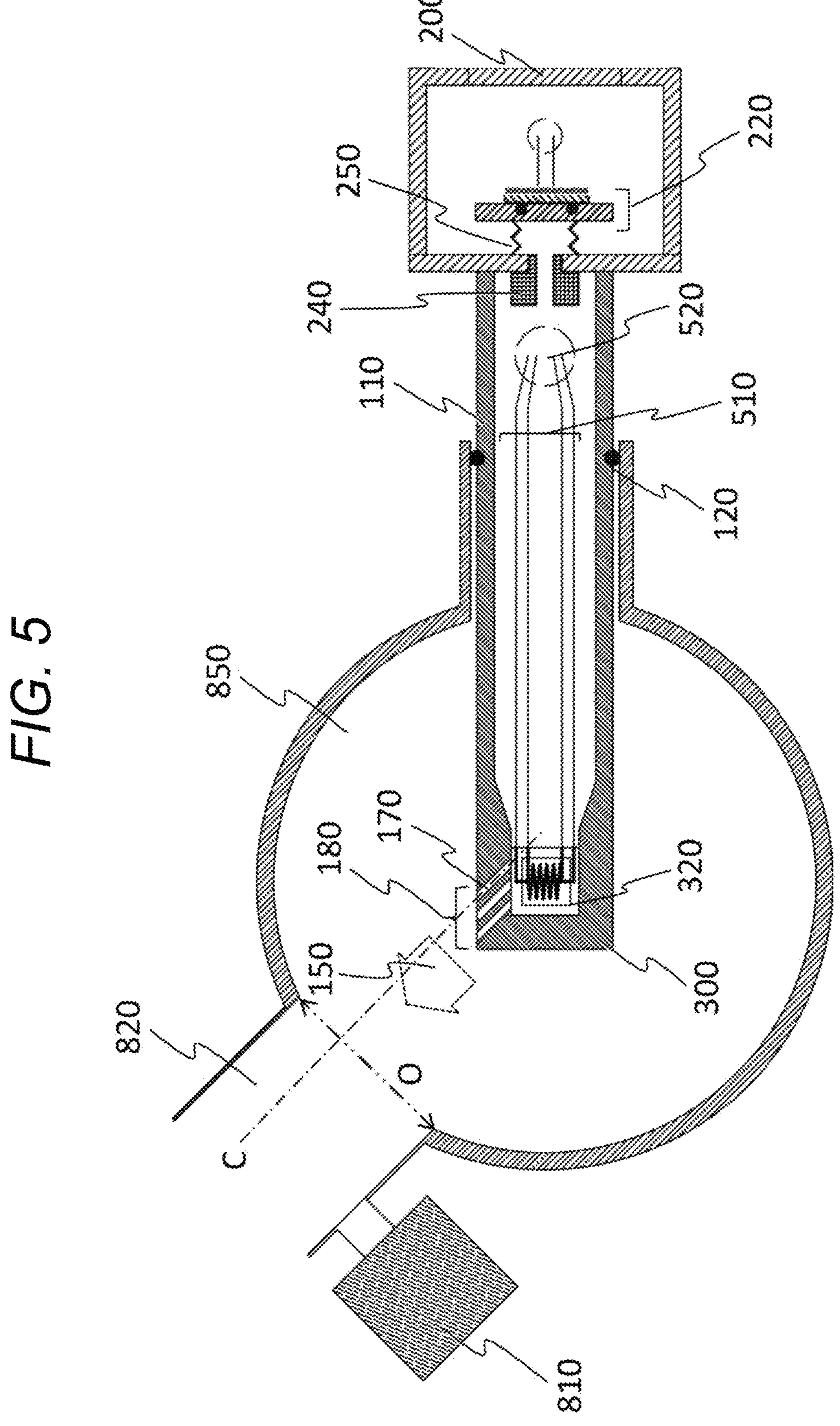
FIG. 5 is a diagram for describing a sample holder according to a second modification.

In the example of the configuration of the sample holder 100 illustrated in FIGS. 2 and 4, the gas is released from the open end 130 of the sample holder 100 at the tip of the sample holder 100. Meanwhile, it is known that when the gas introduction pipe for introducing the gas to the sample, and the gas discharge pipe for discharging the gas are arranged to face each other with the sample located between the gas introduction pipe and the gas discharge pipe, the introduced gas can be effectively discharged and a change in the pressure within the sample chamber is suppressed. However, in a configuration of a sample chamber 850 of a general TEM, a discharge pipe 820 connected to the sample chamber 850 is not arranged to face a position at which a sample holder 100 is inserted. FIG. 5 illustrates an example of a configuration of a sample holder according to a second modification. The sample holder according to the second modification enables a direction in which an exhaust gas stream 150 from an open end flows to be aligned with a direction in which a discharge pipe 820 of a sample chamber 850 extends.

FIG. 5 is a plan sectional view illustrating the sample chamber 850 in a state in which the sample holder according to the second modification is inserted in the sample chamber 850. The discharge pipe 820 is provided with a pressure gauge 810 for measuring pressure within the sample chamber 850. The discharge pipe 820 is provided in a direction different from a longitudinal direction of the sample holder disposed in the sample chamber 850.

An orifice row 180 having discharge orifices 170 arranged in a matrix is disposed in a side surface of the sample holder according to the second modification. The side surface of the sample holder in which openings of the orifice row 180 are disposed faces the discharge pipe 820 in a state in which the sample holder is disposed in the sample chamber 850. It is desirable that the discharge orifices 170 are formed such that the central axes C of the discharge orifices 170 pass through an opening O of the discharge pipe 820 and that an exhaust gas stream 150 from the discharge orifices 170 directly flow into the discharge pipe 820. To reduce an angular distribution of a released gas stream, it is desirable to increase the ratio of the length of each discharge orifice 170 to the diameter of each discharge orifice 170. To reduce gas discharge resistance, it is desirable that the orifice row 180 include as many orifices having similar shapes as geometrically possible.

In the above-described embodiment, the TEM can be used to examine a phase change and a structural change that may cause a decrease in the efficiency of a catalyst in gas under a heating condition. Particularly, when the method for controlling the supply of the pulsed gas is applied as illustrated in FIG. 3, it is possible to observe a chemical reaction in high-pressure gas using a microscope, which was difficult with conventional differential pumping type electron microscopy, and electromagnetic field measurement is possible by using electron holography.

In the above-described embodiment, the observation using the TEM is described as an example, but the scope of the application is not limited thereto. The embodiment can be applied to environment-controlled observation with a scanning electron microscope using the side-entry sample holder, prevention of static charge with the scanning electron microscope using the side-entry sample holder, and a focused ion beam processing device. In the present embodiment, the sample can be heated using the MEMS heating chip 320 as an example. In a case where it is not necessary to heat the sample, a MEMS chip that does not include the metal heater 350 can be used. The membrane 340 and the silicon frame 330 supporting the membrane 340 are provided as a basic configuration. Chips on which samples are placed are collectively referred to as MEMS chips.

The present invention is not limited to the above-described embodiments and includes various modifications. For example, the embodiments and the modifications are described in detail to make the present invention easy to understand, and are not necessarily limited to those including all the configurations described above. In addition, a part of a configuration described in a certain embodiment or modification can be replaced with a configuration described in another embodiment or modification. Furthermore, a configuration described in a certain embodiment or modification can be added to a configuration described in another embodiment or modification. It is possible to add, delete, or replace a part of the configuration described in each embodiment or modification to, from, or with another configuration described in each embodiment or modification.

REFERENCE SIGNS LIST

100: side-entry sample holder
110: holder outer cylinder
120: O ring
130: open end
140: ejected gas stream
150: exhaust gas stream
160: exhaust gas stream
170: discharge orifice
180: orifice row
190: sample holding section
200: gas reservoir tank
210: gas introduction valve
212: discharge/purge valve
220: high-speed valve
222: sealing ring
223: cantilever
224: valve sheet
226: piezoelectric element
230: high-voltage wiring
232: high-voltage introduction terminal
240: gas ejection orifice
250: vibration-proof bellows
300: sample stage
310: sample
320: MEMS heating chip
330: silicon frame
340: membrane
350: metal heater
360: electron beam passage hole
400: upper cover
410: electron beam passage hole
420: electron beam permeable membrane
510: heater wiring
520: current introduction terminal
710: piezoelectric element drive power source
730: source measure unit
740: control computer
800: column
810: pressure gauge
820: discharge pipe
830: electron gun
832: gun valve
840: irradiation system
850: sample chamber
860: objective lens
870: enlargement system
880: observation chamber
890: camera
900: vacuum pump

What is claimed is:

1. A sample holder that holds a sample to be observed using an electron microscope, the sample holder comprising:
a cylindrical holder outer cylinder;
a sample holding section that is connected to one end of the holder outer cylinder and holds the sample;
a gas reservoir tank that is connected to another end of the holder outer cylinder and stores gas;
an orifice for ejecting the gas stored in the gas reservoir tank into the holder outer cylinder; and
a valve for controlling a flow of the gas stored in the gas reservoir tank into the orifice, wherein
the sample holding section has an open end for discharging the gas supplied from the gas reservoir tank and having passed through the sample.

2. The sample holder according to claim 1,
wherein the valve is a piezoelectric driven valve.

3. The sample holder according to claim 1,
wherein the valve is connected to the gas reservoir tank via a vibration-proof mechanism.

4. The sample holder according to claim 1,
wherein the sample holding section includes a sample stage and an upper cover each having an electron beam passage hole, and
a MEMS chip is disposed above the electron beam passage hole of the sample stage, and
includes a membrane on which the sample is placed, and a silicon frame supporting the membrane.

5. The sample holder according to claim 4,
wherein the MEMS chip further includes a metal heater on the membrane, and
at least a portion of a heater wiring through which a current is introduced into the metal heater is disposed in the holder outer cylinder.

6. The sample holder according to claim 4,
wherein an electron beam permeable membrane that suppresses the discharge of the gas supplied from the gas reservoir tank through the electron beam passage hole of the upper cover is disposed on the electron beam passage hole of the upper cover.

7. The sample holder according to claim 1,
wherein the sample holding section has, as the open end, an orifice row in which discharge orifices for discharging the gas supplied from the gas reservoir tank and having passed through the sample are arranged in a matrix.

8. The sample holder according to claim 1,
wherein a cross-sectional area of the holder outer cylinder is 10 times or more a cross-sectional area of the orifice.

9. An electron microscope system that includes an electron microscope having a column including an electron optical system, and in which the sample holder according to claim 1 is inserted from a side surface of the column,
the electron microscope system comprising:
a valve drive power source that controls opening and closing of the valve; and
a control computer that controls the valve drive power source, wherein
the control computer transmits a pulse control signal for controlling the opening degree of the valve to the valve drive power source to supply pulsed gas to the sample.

10. The electron microscope system according to claim 9, further comprising a source measure unit, wherein
a MEMS heating chip is disposed on the sample holding section of the sample holder,
the MEMS heating chip includes a membrane on which the sample is placed, a silicon frame supporting the membrane, and a metal heater disposed on the membrane, and
the source measure unit introduces a current into the metal heater via a heater wiring.

11. The electron microscope system according to claim 10,
wherein the control computer controls the source measure unit to introduce the current into the metal heater synchronizing with the pulse control signal.

12. The electron microscope system according to claim 9, wherein
a discharge pipe for discharging gas from a sample chamber in which the sample holder is disposed,
the sample holding section of the sample holder has, as the open end, an orifice row in which discharge orifices for discharging gas supplied from the gas reservoir tank and having passed through the sample are arranged in a matrix, and
central axes of the discharge orifices pass through an opening of the discharge pipe.

13. A sample observation method for observing a sample held in a sample holder using an electron microscope system, wherein
the sample holder includes a cylindrical holder outer cylinder, a sample holding section that is connected to one end of the holder outer cylinder and holds the sample, a gas reservoir tank that is connected to another end of the holder outer cylinder and stores gas, an orifice for ejecting the gas stored in the gas reservoir tank into the holder outer cylinder, and a valve for controlling a flow of the gas stored in the gas reservoir tank into the orifice, the sample holding section has an open end for discharging the gas supplied from the gas reservoir tank and having passed through the sample,
the electron microscope system includes an electron microscope including a column that includes an electron optical system and in which the sample holder is inserted from a side surface of the column, a valve drive power source, and a control computer that controls the valve drive power source,
the sample observation method comprising:
causing the control computer to transmit, to the valve drive power source, a pulse control signal for controlling an opening degree of the valve at a time of the observation of the sample; and
causing the valve drive power source to control the opening and closing of the valve to supply pulsed gas to the sample in response to the pulse control signal.

14. The sample observation method according to claim 13, wherein
after the control computer continuously transmits the pulse control signal to the valve drive power source a plurality of times, the control computer transmits a control signal of a base voltage to the valve drive power source,
the valve drive power source closes the valve in response to the control signal of the base voltage,
the electron microscope acquires an image of the sample a plurality of times in order to add the images during a period of time when the control computer transmits the control signal of the base voltage to the valve drive power source.

15. The sample observation method according to claim 13, wherein
a MEMS heating chip is disposed on the sample holding section of the sample holder,
the MEMS heating chip includes a membrane on which the sample is placed, a silicon frame supporting the membrane, and a metal heater disposed on the membrane,
the electron microscope system includes a source measure unit that introduces a current into the metal heater via a heater wiring, and
the control computer controls the source measure unit to introduce the current into the metal heater synchronizing with the pulse control signal.

16. The sample observation method according to claim 14, wherein
a MEMS heating chip is disposed on the sample holding section of the sample holder,
the MEMS heating chip includes a membrane on which the sample is placed, a silicon frame supporting the membrane, and a metal heater disposed on the membrane,
the electron microscope system includes a source measure unit that introduces a current into the metal heater via a heater wiring, and the control computer controls the source measure unit to introduce the current into the metal heater synchronizing with the pulse control signal.

* * * * *